(12) United States Patent
Xie et al.

(10) Patent No.: US 8,547,242 B2
(45) Date of Patent: Oct. 1, 2013

(54) POWER SUPPLY DETECTING CIRCUIT INDICATING A PREDETERMINED VOLTAGE RANGE

(75) Inventors: Ling-Yu Xie, Shenzhen (CN); Xing-Ping Xie, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 380 days.

(21) Appl. No.: 13/025,311

(22) Filed: Feb. 11, 2011

(65) Prior Publication Data
US 2012/0044078 A1 Feb. 23, 2012

(30) Foreign Application Priority Data
Aug. 17, 2010 (CN) .......................... 2010 1 0255324

(51) Int. Cl.
*G08B 21/00* (2006.01)

(52) U.S. Cl.
USPC ............................ 340/660; 340/661; 340/662

(58) Field of Classification Search
USPC ............... 340/635, 636.1, 660, 661, 662, 663
See application file for complete search history.

(56) References Cited

U.S. PATENT DOCUMENTS 3,810,144 A * 5/1974 Clouse ........................ 340/636.1
3,820,099 A * 6/1974 Vogt .............................. 340/662

* cited by examiner

*Primary Examiner* — Jeffery Hofsass
(74) *Attorney, Agent, or Firm* — Altis & Wispro Law Group, Inc.

(57) ABSTRACT

A detecting circuit includes an indicating light, a switch component, and a control component. The indicating light indicates whether a voltage rail output by a power supply is within a predetermined voltage range. The switch component has a first terminal connected to the voltage rail, a second terminal connected to the indicating light, and a control terminal. The control component is connected to the control terminal of the switch component. The control component switches on the switch component to power on the indicating light when the voltage rail is within the predetermined voltage range, or switches off the switch component to power off the indicating light when the voltage rail is out of the predetermined voltage range.

16 Claims, 3 Drawing Sheets

POWER SUPPLY DETECTING CIRCUIT INDICATING A PREDETERMINED VOLTAGE RANGE

BACKGROUND

1. Technical Field

The present disclosure relates to a power supply detecting circuit.

2. Description of Related Art

A computer power supply can output multiple voltage rails including 3.3V, 5V, and 12V. The voltage rails can be supplied to various components in a computer. Each of the voltage rails output by the power supply should fall in a standard voltage range. For example, a voltage of the 3.3V power should fall in a range of $(1\pm5\%)\times3.3V$, which allows a 5% deviation rate. However, typical testing method for the power supply does not detect weather the voltage rails are within the predetermined range.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
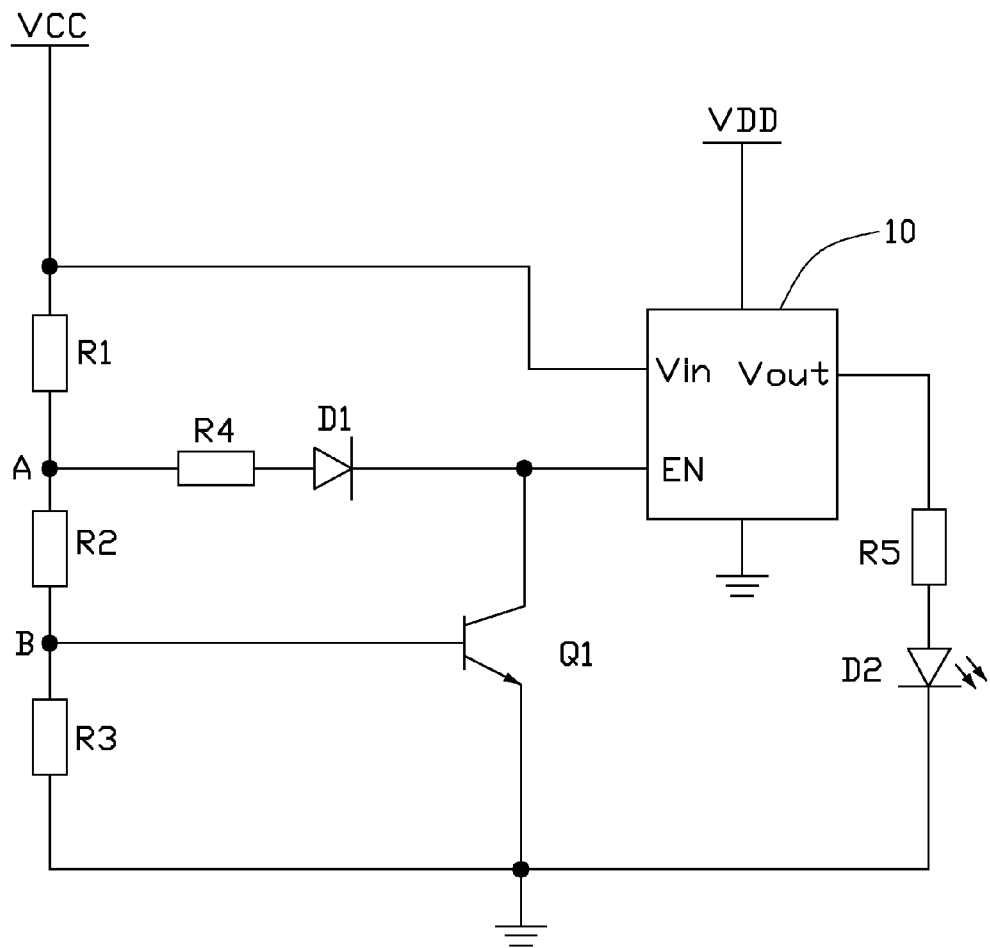
FIG. 1 is a power supply detecting circuit in accordance with a first embodiment.
Figure 2:
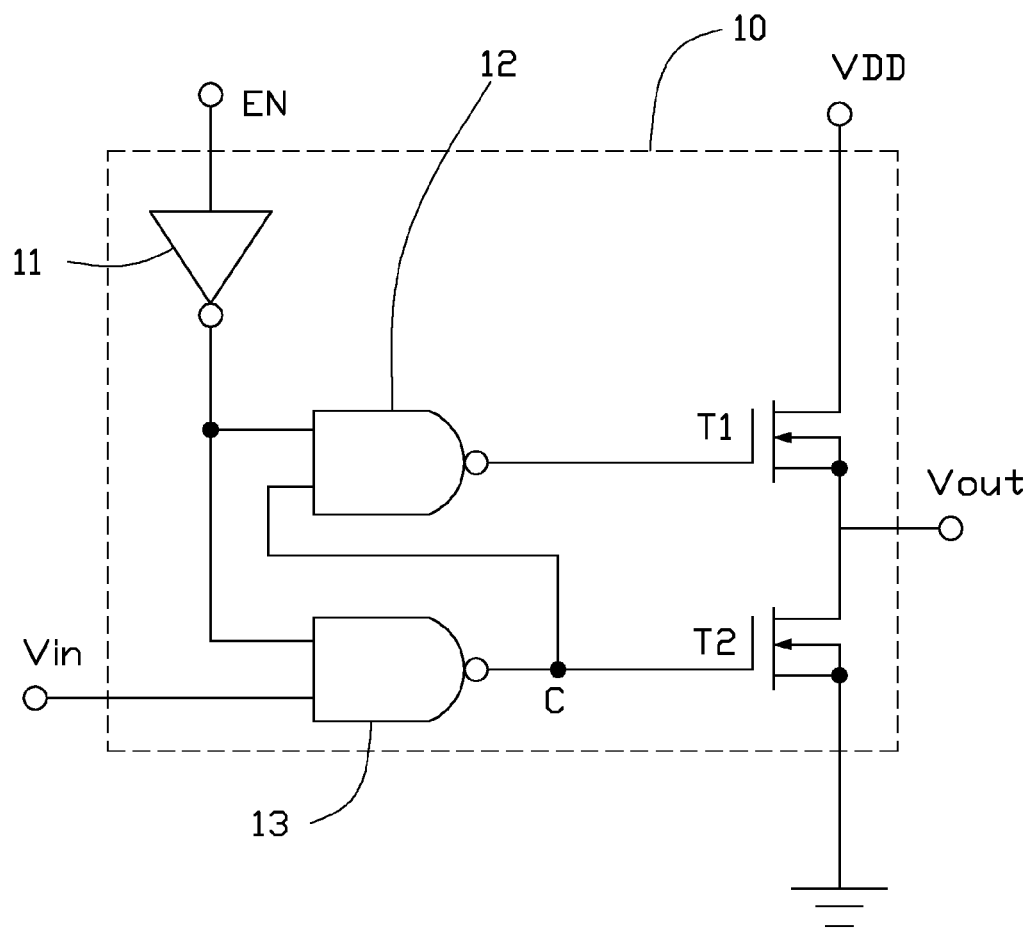
FIG. 2 illustrates a detail interior construction of a switch component of FIG. 1.

Referring to FIGS. 1 and 2, an embodiment of a power supply detecting circuit includes resistors R1~R5, a diode D1, an indicating light D2, an NPN transistor Q1, and a switch component 10. In one embodiment, the indicating light D2 is a light emitting diode.

A first terminal of the resistor R1 is connected to a voltage rail VCC output by a computer power supply (not shown), and a second terminal of the resistor R1 is connected to a node A. A first terminal of the resistor R2 is connected to the node A, and a second terminal of the resistor R2 is connected to a node B. A first terminal of the resistor R3 is connected to the node B, and a second terminal of the resistor R3 is connected to ground. A first terminal of the resistor R4 is connected to the node A, and a second terminal of the resistor R4 is connected to an anode of the diode D1. A cathode of the diode D1 is connected to the switch component 10.

The switch component 10 includes a control terminal (EN) connected to the cathode of the diode D1, an input terminal (Vin) connected to the voltage rail VCC, and an output terminal (Vout) connected to a positive terminal of the indicating light D2 via the resistor R5. A negative terminal of the indicating light D2 is connected to ground. A base terminal of the NPN transistor Q1 is connected to the node B. A collector terminal of the NPN transistor Q1 is connected to the control terminal (EN) of the switch component 10. An emitter terminal of the NPN transistor Q1 is connected to ground.

In an example as shown in FIG. 2, the switch component 10 is a chip integrated with an inverting gate 11, a first nor gate 12, a second nor gate 13, a first Field effective Transistor (FET) T1 and a second FET T2. The first FET T1 and the second FET T2 are both N-channel-enhancement FETS. An input terminal of the inverting gate 11 is connected to the control terminal (EN) of the switch component 10. An output terminal of the inverting gate 11 is connected to an upper input terminal of each of the first nor gate 12 and the second nor gate 13. A lower input terminal of the first nor gate 12 is connected to a node C. An output terminal of the first nor gate 12 is connected to a gate terminal of the transistor T1. A lower input terminal of the second nor gate 13 is connected to the input terminal (Vin) of the switch component 10. An output terminal of the second nor gate 13 is connected to the node C. A drain terminal of the transistor T1 is supplied with a power source VDD. A source terminal of the transistor T1 is connected to a drain terminal of the transistor T2. A gate terminal of the transistor T2 is connected to the node C. A source terminal of the transistor T2 is connected to ground.

When a voltage at the control terminal (EN) of the switch component 10 is at high level (e.g., greater than 1.2 volts), the switch component is the output terminal (Vout) is connected to the input terminal (Vin) and at the same voltage level with the input terminal (Vin) (switch on). When a voltage at the control terminal (EN) of the switch component 10 is at low level (e.g., less than 1.2 volts), the output terminal (Vout) is disconnected from the input terminal (Vin) and at low voltage level (e.g., o volt).

After the computer power supply is powered on, the voltage rail VCC starts to power up. When the voltage of voltage rail VCC is less than a predetermined voltage range, a voltage of the node B is less than a threshold voltage that can switch on the NPN transistor Q1. Then the NPN transistor Q1 is rendered non-conductive. A voltage of the control terminal (EN) of the switch component 10 is at low voltage level. The output terminal (Vout) is disconnected from the input terminal (Vin) and at low voltage level. Thus, the indicating light D2 is powered off.

When the voltage of the voltage rail VCC falls in the predetermined voltage range, the voltage of the node B is less than the threshold voltage that can switch on the NPN transistor Q1. Then the NPN transistor is rendered non-conductive. The voltage of the control terminal (EN) of the switch component 10 is at high voltage level. The output terminal (Vout) is connected to the input terminal (Vin) and at the same voltage level as the voltage rail VCC. Then, the indicating light D2 is powered on to indicate that the voltage of the voltage rail VCC is within the predetermined voltage range.

When the voltage of the voltage rail VCC exceeds the predetermined voltage range, the voltage of the node B is greater than the threshold voltage that can switch on the NPN transistor Q1. Then the NPN transistor is rendered conductive. The control terminal (EN) of the switch component 10 is grounded and at low voltage level. The output terminal (Vout) is disconnected from the input terminal (Vin) and at low voltage level. Thus, the indicating light D2 is powered off.

Figure 3:
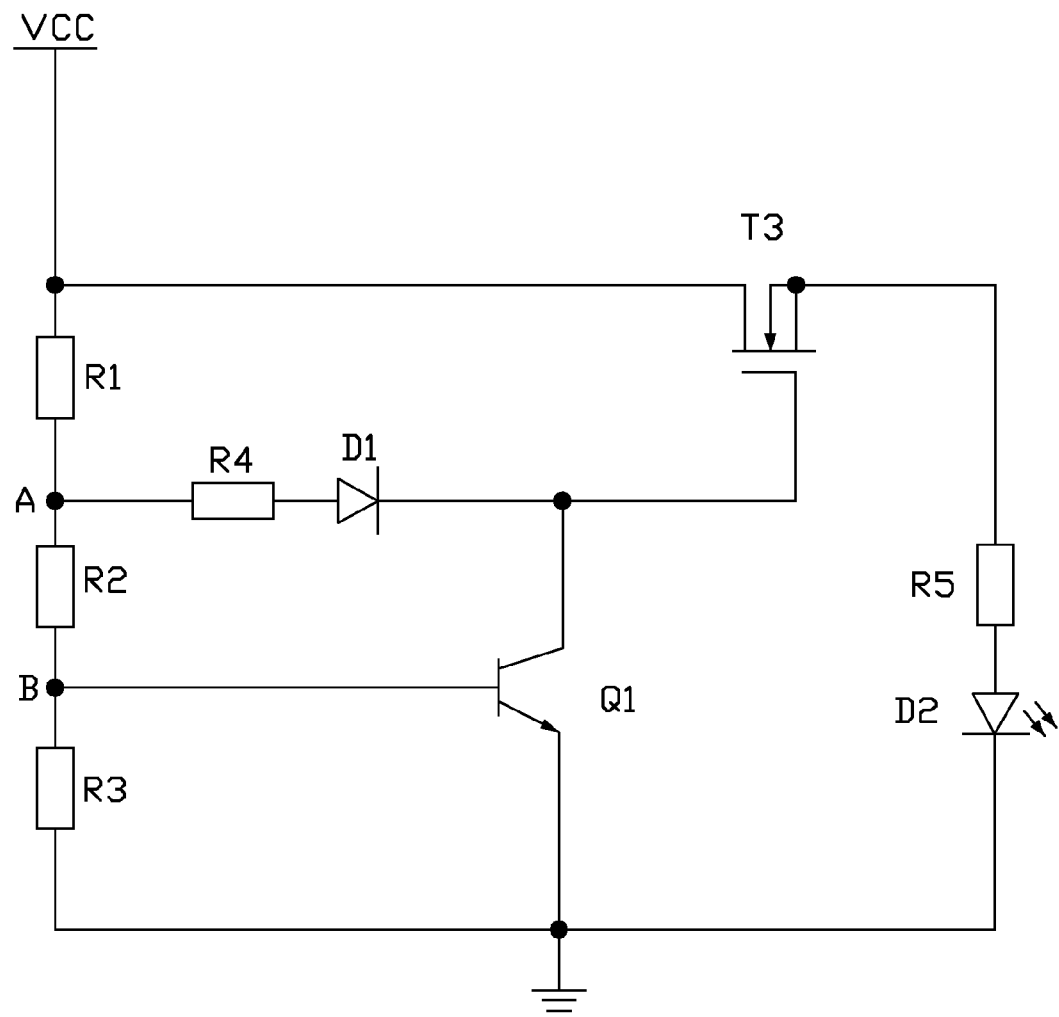
FIG. 3 is a power supply detecting circuit in accordance with a second embodiment.

Referring to FIG. 3, in another example as shown in FIG. 3, an N-channel enhancement FET T3 is utilized in the power supply detecting circuit. The N-channel-enhancement FET T3 can perform similar functions as the switch component 10 described above.

While the present disclosure has been illustrated by the description of preferred embodiments thereof, and while the preferred embodiments have been described in considerable detail, it is not intended to restrict or in any way limit the scope of the appended claims to such details. Additional advantages and modifications within the spirit and scope of the present disclosure will readily appear to those skilled in the art. Therefore, the present disclosure is not limited to the specific details and illustrative examples shown and described.

What is claimed is:

1. A detecting circuit comprising:
an indicating light configured to indicate whether a voltage rail provided by a power supply is within a predetermined voltage range;
a switch component having a first terminal connected to the voltage rail, a second terminal connected to the indicating light, and a control terminal, the switch component is a chip integrated with an inverting gate, a first nor gate connected to an output terminal of the inverting gate, a second nor gate connected to the first nor gate, a first field effective transistor connected to the first nor gate, and a second field effective transistor connected to the second nor gate; and
a control component, connected to the control terminal of the switch component, capable of controlling an on or off state of the switch component according to the voltage rail;
wherein the control component is configured to switch on the switch component to power on the indicating light when the voltage rail is within the predetermined voltage range, and switch off the switch component to power off the indicating light when the voltage rail is out of the predetermined voltage range.

2. The detecting circuit of claim 1, wherein the control component is a transistor; and a base terminal of the transistor is connected to the voltage rail, a collector terminal of the transistor is connected to the control terminal of the switch component, and an emitter terminal of the transistor is connected to ground.

3. The detecting circuit of claim 2, further comprising a first resistor and a second resistor, the first resistor is connected to the voltage rail and a first node, and the second resistor is connected to the first node and the base terminal of the transistor.

4. The detecting circuit of claim 3, further comprising a third resistor connected to the base terminal of the transistor and ground.

5. The detecting circuit of claim 4, further comprising a fourth resistor and a diode, wherein the fourth resistor is connected to the first node and an anode of the diode, and a cathode of the diode is connected to the control terminal of the switch component.

6. The detecting circuit of claim 5, wherein the indicating light is a light emitting diode, a positive terminal of the light emitting diode is connected to the second terminal of the switch component via a fifth resistor, and a negative terminal of the light emitting diode is connected to ground.

7. The detecting circuit of claim 2, wherein the switch component is a field effective transistor, a gate terminal of the field effective transistor is connected to the control component, a drain terminal of the field effective transistor is connected to the voltage rail, and a source terminal of the field effective transistor is connected to the indicating light.

8. The detecting circuit of claim 1, wherein the transistor is an NPN transistor, and the first field effective transistor and the second field effective transistor are N-channel enhancement field effective transistors.

9. A detecting circuit comprising:
an indicating light configured to indicate whether a voltage rail provided by a power supply is within a predetermined voltage range;
a first switch component having a first terminal connected to the voltage rail, a second terminal connected to the indicating light, and a control terminal, the first switch component is a chip integrated with an inverting gate, a first nor gate connected to an output terminal of the inverting gate, a second nor gate connected to the first nor gate, a first field effective transistor connected to the first nor gate, and a second field effective transistor connected to the second nor gate; and
a second switch component, connected to the control terminal of the first switch component, capable of controlling an on or off state of the first switch component;
wherein the second switch component is configured to switch on the first switch component to power on the indicating light when the voltage rail is within the predetermined voltage range, and switch off the first switch component to power off the indicating light when the voltage rail is out of the predetermined voltage range.

10. The detecting circuit of claim 9, wherein the second switch component is a transistor, and a base terminal of the transistor is connected to the voltage rail, a collector terminal of the transistor is connected to the control terminal of the first switch component, and an emitter terminal of the transistor is connected to ground.

11. The detecting circuit of claim 10, further comprising a first resistor and a second resistor, the first resistor is connected to the voltage rail and a first node, and the second resistor is connected to the first node and the base terminal of the transistor.

12. The detecting circuit of claim 11, further comprising a third resistor connected to the base terminal of the transistor and ground.

13. The detecting circuit of claim 12, further comprising a fourth resistor and a diode, the fourth resistor is connected to the first node and an anode of the diode, and a cathode of the diode is connected to the control terminal of the first switch component.

14. The detecting circuit of claim 13, wherein the indicating light is a light emitting diode, a positive terminal of the light emitting diode is connected to the second terminal of the first switch component via a fifth resistor, and a negative terminal of the light emitting diode is connected to ground.

15. The detecting circuit of claim 10, wherein the first switch component is a field effective transistor, a gate terminal of the field effective transistor is connected to the second switch component, a drain terminal of the field effective transistor is connected to the voltage rail, and a source terminal of the field effective transistor is connected to the indicating light.

16. The detecting circuit of claim 9, wherein the transistor is an NPN transistor, and the first field effective transistor and the second field effective transistor are N-channel enhancement field effective transistors.

* * * * *